United States Patent [19]
Chu et al.

[11] Patent Number: 5,926,695
[45] Date of Patent: Jul. 20, 1999

[54] LEAD FRAME INCORPORATING MATERIAL FLOW DIVERTERS

[75] Inventors: Chin S. Chu, Sunnyvale; Peter Spalding, Cupertino, both of Calif.

[73] Assignee: National Semiconductor Corporation, Santa Clara, Calif.

[21] Appl. No.: 08/872,658

[22] Filed: Jun. 10, 1997

[51] Int. Cl.[6] .......................... H01L 21/44; H01L 23/495
[52] U.S. Cl. .................. 438/111; 438/123; 438/124; 257/667; 257/676
[58] Field of Search ......................... 438/111, 112, 438/123, 124, 126, 127; 257/666, 667, 676, 787

[56] References Cited

U.S. PATENT DOCUMENTS

| | | | |
|---|---|---|---|
| 4,298,883 | 11/1981 | Komatsu et al. | 257/667 |
| 5,018,003 | 5/1991 | Yasunaga et al. | 438/124 |
| 5,304,841 | 4/1994 | Negoro | 257/667 |
| 5,371,044 | 12/1994 | Yoshida et al. | 438/124 |

*Primary Examiner*—Kevin M. Picardat
*Attorney, Agent, or Firm*—Beyer & Weaver, LLP

[57] ABSTRACT

Disclosed are methods and apparatuses for manufacturing a semiconductor device package utilizing a lead frame which has one or more encapsulant material flow diverters. The lead frame having material flow diverters includes a multiplicity of leads and at least material flow diverter. The material flow diverter is arranged in such a manner as to control the amount of encapsulant material which is directed both above and below an attached die during the encapsulation process.

17 Claims, 12 Drawing Sheets

LEAD FRAME INCORPORATING MATERIAL FLOW DIVERTERS

BACKGROUND OF THE INVENTION

The present invention relates generally to lead frames for use in integrated circuit packaging and more particularly, lead frames having flow diverters for bifurcating the flow of encapsulating material during the molding of a package for a semiconductor device.

Semiconductor dies are created from a silicon wafer through the employment of various etching, doping, and depositing steps that are well known in the art. Ultimately, the semiconductor die may be packaged by forming an encapsulant around the semiconductor die so as to form an "integrated circuit package" having a variety of pinouts or mounting and interconnection schemes. Plastic is often utilized as an encapsulant. Integrated circuit packages that utilize plastic as an encapsulant are less expensive then other packaging options and provide performance and reliability that is acceptable for a number of different applications.

An array of electrical conductors called a "lead frame" forms both the support structure for a packaged semiconductor die as well as the conductive paths between a semiconductor die and external circuitry consisting of a set of lead frame fingers otherwise known as leads. On one end, each lead is electrically connected to the semiconductor die by means of a bonding wire. For instance, in the case of a lead on die package, each lead is designed to align with and connect to one of a series of connection, or bond, pads that are located on the face of a semiconductor die. These bond pads are the points at which all input and output signals, as well as power and ground connections, are made for the semiconductor die to function as designed. The other end of the leads, being external to the integrated circuit package and extending from the leads are further connected to external circuitry or alternatively may be connected to an intermediate package such as a hybrid circuit or multichip module.

As illustrated in FIGS. 1(a) and 1(b), a conventional lead frame 10 generally includes an array of electrically conductive leads 11, a support pad 12 which is downset relative to the leads 11, and lead frame body 18. The support pad 12 is composed of a die attach area 13 (which supports an attached semiconductor die 20), a support hole 15, support arms 17 (used to support the die support area during handling), and flow holes 14. Conventional lead frames are typically formed from a single metal strip. The lead forming step itself may be either an etching process or a stamping process. In these processes the areas between the desired features are removed through either stamping or etching. In the etching process, a mask of the pattern of the desired features is laid over a metal strip. The exposed areas are then etched away creating the features desired in the metal strip. The stamping process usually consists of stamping out the desired patterns in the lead frame blank. Multiple stamp tool punches, shaped in the form of the respective patterns punch out the respective features in the lead frame blank. A pressing tool then forces the support pad 12 (including the die attach area 13, support hole 15 and flow holes 14) to become downset relative to the leads 11 and the body of the lead frame 18.

Fabrication methods for semiconductor die packages are well known to those skilled in the art of semiconductor packaging and are generally straightforward. A semiconductor die 20 is attached to the die attach area 13 and associated bond pads 22 are electrically connected to the lead tips 16 with bonding wires 21. An encapsulant material is then used to surround the inner portion of the lead frame, including the attached semiconductor die 20 and a substantial portion of the leads 11. The excess metal 18 that supported the entire lead frame 10 is then trimmed away to free the leads 11 from each other. The end product is a packaged semiconductor device.

One of the disadvantages with this method of packaging a semiconductor device is due to the fact the encapsulant material is applied in the form of a primary stream 30 which due to the downset nature of the support pad 12, preferentially surrounds the upper surface 23 of the die attach area 12 which includes the attached semiconductor die 20. As the encapsulant material is applied, an upper flowstream 31 impinging on the upper surface 23 of the die attach area 12 and a separate lower flowstream 32 of encapsulant impinging on the lower surface 19 of the die attach area 13 are created, the flow rate of the upper flowstream 31 being substantially greater then the flow rate of the lower flowstream 32. The difference in flow rates causes a pressure gradient to develop between the upper surface 23 of the die attach area 12 and lower surface 19 of the die attach area 13. This pressure gradient causes 1) any gas bubbles to become entrapped beneath die attach area 13 since the faster moving upper flowstream 31 prevents the bubbles from escaping which results in a multitude of voids in the region beneath die attach area 13 after final curing of the encapsulant, and 2) the die attach area 13 to be forced out of planar alignment with the lead frame body 18 and the leads; this misalignment adversely affects the integrity of the wires 21 attached to the bond pads 22 on the semiconductor die 20 by mechanically stressing both the bond pad/bond wire junctions and the bond wires themselves. The non-uniformity of the thickness of the encapsulant on the underside of the die attach area 19 adversely affects both package heat transfer characteristics and package long term reliability. In order to mitigate the problems caused by this pressure gradient, flow holes 14 are used to increase the flow rate of the lower stream 32 relative to the upper flowstream 31 by diverting a portion of the primary flow 30 of encapsulant to the lower flowstream 32 in an attempt to equalize the flow rates. However, in some implementations, the flow holes 14 alone cannot divert a sufficient amount of encapsulant material to the lower flowstream 32 to prevent the creation of the pressure gradient with the abovementioned adverse effects.

The present invention provides a means for adjustably increasing the flowrate of he lower stream 32 of encapsulating material and thus reducing or eliminating the pressure gradient and its associated problems as described. The presently disclosed invention is fully compatible with the standard manufacturing process for lead frames.

SUMMARY OF THE INVENTION

The advantages of the present invention will become apparent to those skilled in the art upon a reading of the following description of the formation of a lead frame with one or more flow diverters and a semiconductor die package with a lead frame having one or more flow diverters.

In one aspect of the present invention, a lead frame having a material flow diverter is set forth. The lead frame includes a plurality of leads, a support pad which includes a die attach area, a flow hole adjacent in the support pad, and a flow diverter integrally formed from the support pad and positioned adjacent to the flow hole. The flow hole is provided to permit encapsulating material to flow through the support pad during a molding operation that occurs during an encapsulation step when the lead frame is packaged in an integrated circuit. The flow diverters are positioned to increase the volume of material that passes through the flow hole. In some embodiments, a plurality of flow diverters are provided. The invention is particularly useful in lead frames wherein the support pad is downset relative to the leads. In another aspect of the present invention, a packaged semiconductor device is set forth that includes the described lead frame is provided.

In another aspect of the present invention, a process for making a lead frame having a material flow diverter is set forth. The process includes forming a plurality of leads and a support pad from a lead frame blank. The support pad includes the die attach area and a flow diverter which is separate from the die attach area. The flow diverter is defined in the support pad separate from the die attach area and is angled upward relative to the support pad when the support pad is downset relative to the leads. In some preferred embodiments, the upward angling of the flow diverter may be accomplished simultaneously with the downsetting using a downsetting machine.

BRIEF DESCRIPTION OF THE DRAWINGS

The features of the present invention may best be understood by reference to the following description of the presently preferred embodiments together with the accompanying drawings in which.

DETAILED DESCRIPTION OF THE PREFERRED EMBODIMENTS

The present invention relates to lead frames that incorporate a material flow diverter in order to adjust the flow rates of encapsulating material that surrounds both the upper and lower portions of the die attach area during the encapsulating step of the manufacture of a semiconductor device package. Also, processes for manufacturing semiconductor device packages containing such flow diverters are also disclosed. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1A:
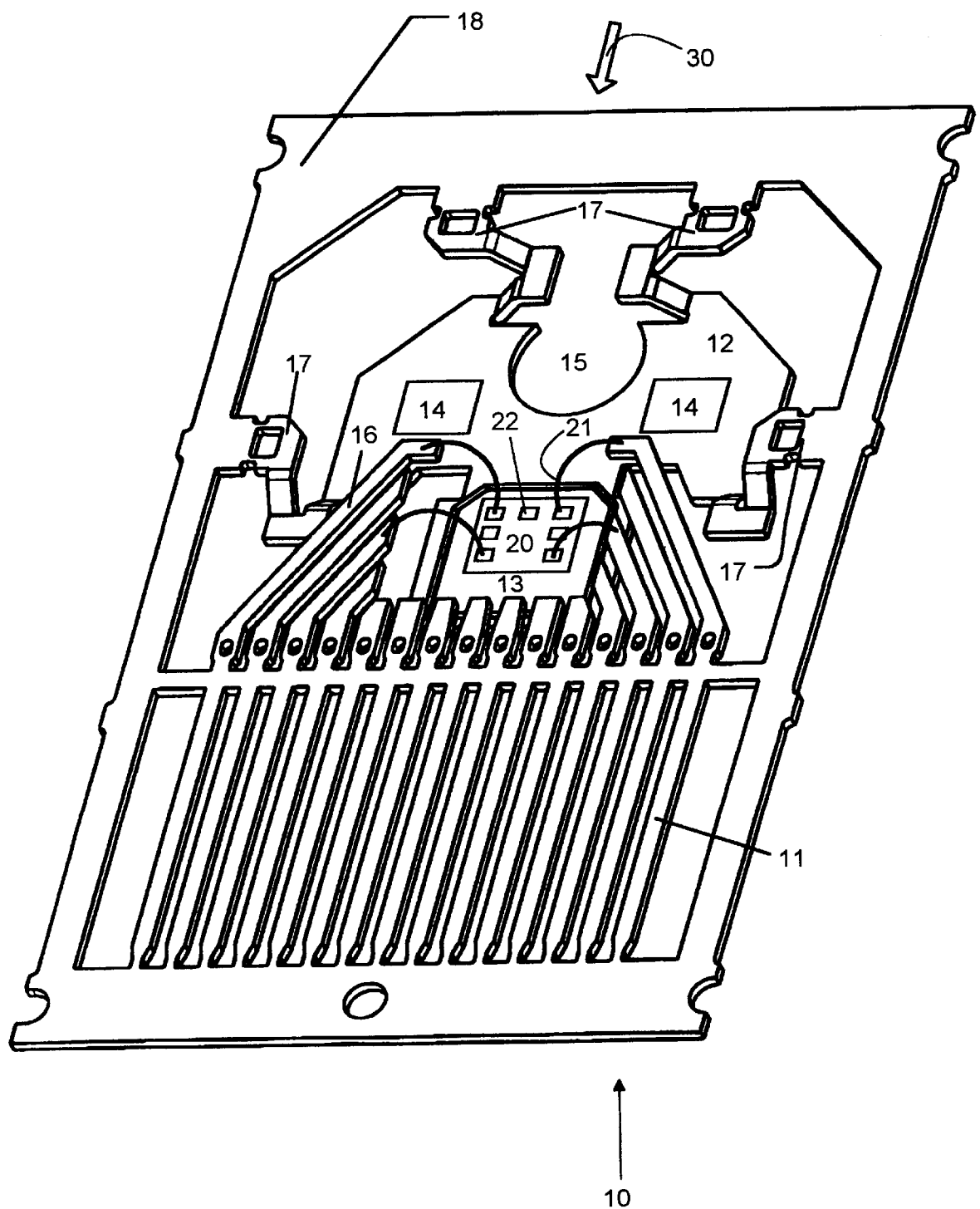
FIG. 1(a) is a diagrammatic plan view of a prior art lead frame assembly.
Figure 1B:
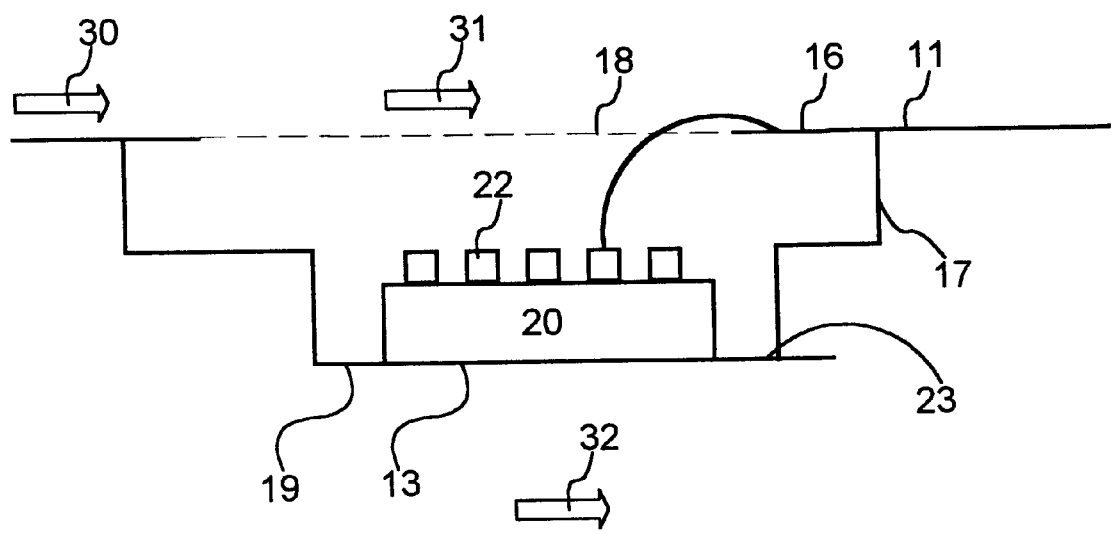
FIG. 1(b) is a diagrammatic side view of a prior art lead frame assembly as shown in FIG. 1(a).
Figure 2:
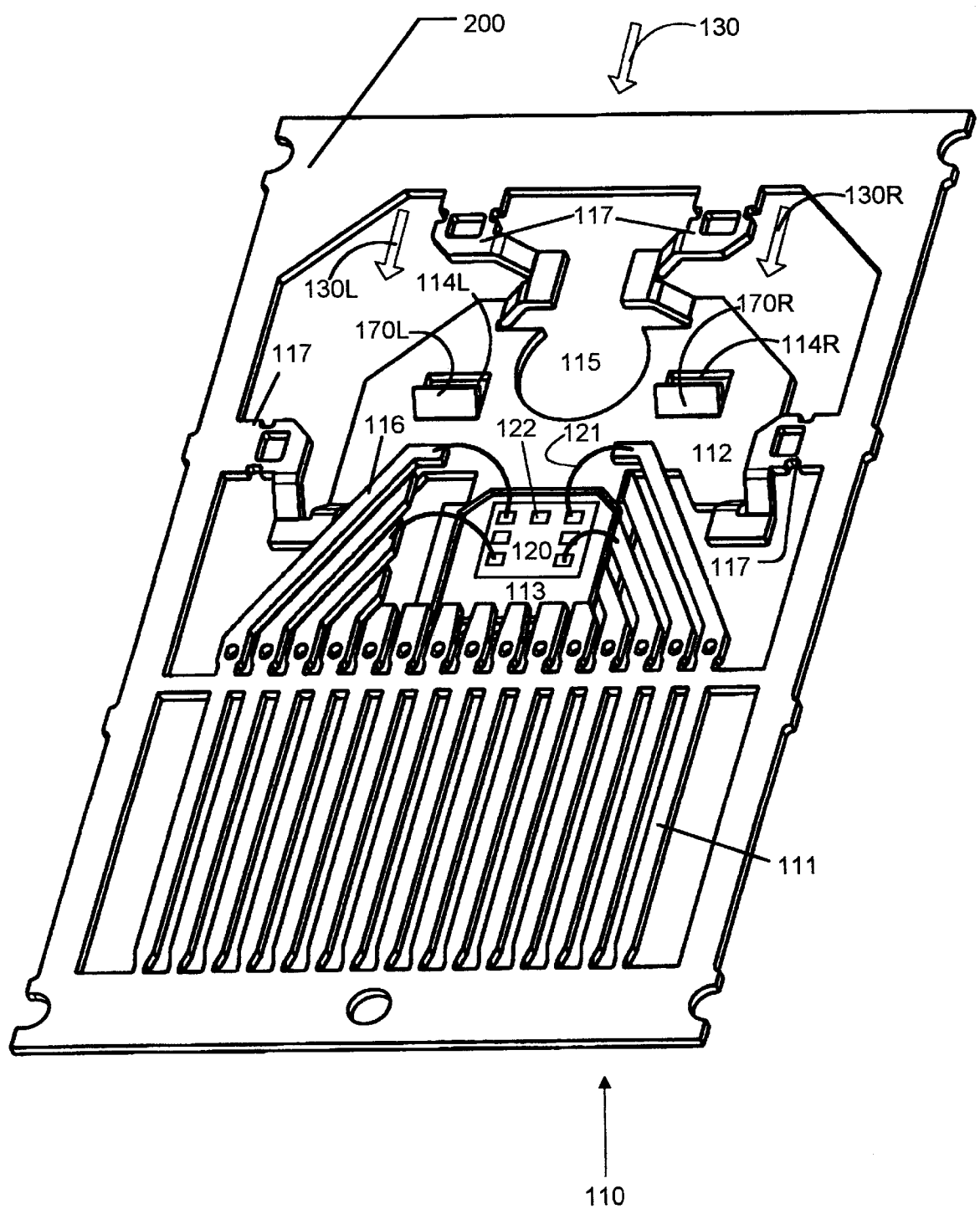
FIG. 2 is a diagrammatic plan top view of a lead frame in accordance with one embodiment of the present invention.
Figure 3:
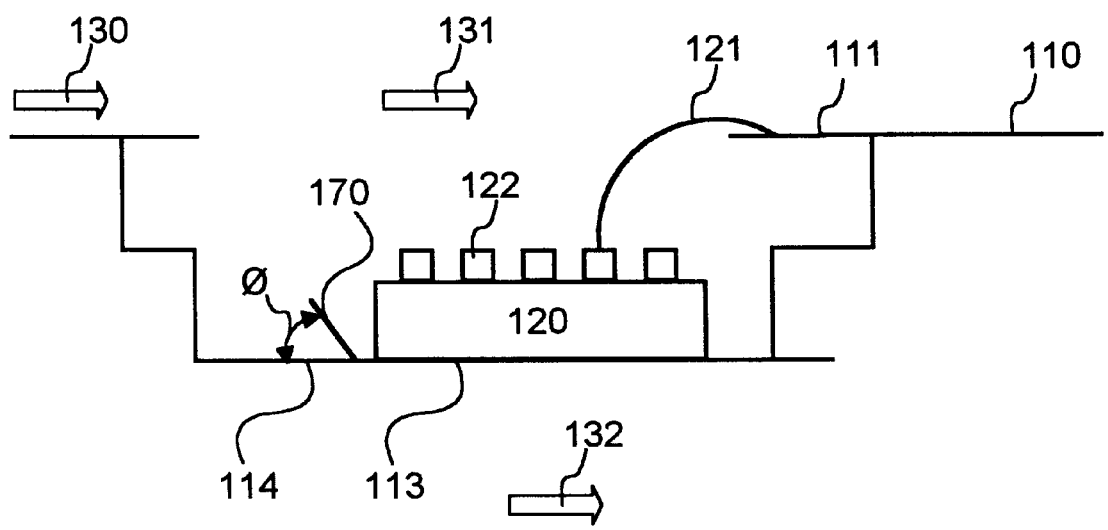
FIG. 3 is a diagrammatic cross sectional view of the lead frame shown in FIG. 2.

Referring initially to FIGS. 2, one embodiment of a lead frame 110 which incorporates a material flow diverter according to the present invention will be described. In this embodiment, the lead frame 110 includes a plurality of leads 111 and a support pad 112 that is downset relative to the leads 111. One end of the leads 111 typically form external pins (as seen in FIG. 3) suitable to connect to external circuitry (not shown). The support pad 112 includes a die attach area 113, a pair of flow holes 114L and 114R and a pair of flow diverters 170L and 170R.

A semiconductor die 120 having bond pads 122 thereon, is mounted on a die attach area, 113, and may be electrically connected to the leads in any conventional manner known in the art. By way of example, this is most commonly accomplished through the use of a plurality of bonding wires 121 which connect associated ones of leads 111 to associated ones of bond pads 122 on die 120. As is well known to those of skill in the art, a lead frame package is arranged to encapsulate die, bonding wires, semiconductor device, and a portion of the leads.

FIG. 3, for illustrative purposes, shows a side-sectional view of the lead frame 110 according to one embodiment of the present invention that incorporates a material flow diverter 170. Die attach pad 113, semiconductor die 120, bonding wires 121, leads 111, are in substantially the same configuration as in FIG. 2. As is shown in FIG. 3, encapsulating material 130 encapsulates the die 120, bonding wires 121, and a portion of the leads 111, to form the final form of the semiconductor device package.

As discussed above, lead frames are typically formed from metal strips. FIG. 2 illustrates the lead frame assembly 110 before it is separated from the strip. Thus, lead frame assembly 110 is enclosed within and supported by lead frame body 200 which is part of the lead frame metal strip from which the lead frame is created. The embodiment of the lead frame 110 that is shown is designed for employment with an overmolded integrated circuit package.

The lead frame 110 includes an array of electrically conductive lead tips 116 and a support pad 1 12, which is downset relative to the leads 111 and lead frame body 200. The support pad 112 is composed of a die attach area 113 (which supports an attached semiconductor die 120), a support hole 115, used to support the lead frame 110 during handling, support arms 117 (used to support the die support area during handling), and flow holes 114L and 114R. A pressing tool forces the support pad 112 (including the die attach area 113, support hole 115 and flow holes 114L and 114R) to become downset relative to the leads 111 and the body of the lead frame 200. The support arms 117 extend out from the support pad 112 to support the support pad during handling.

In this embodiment, the lead frame 110 includes support hole 115 and flow diverters 170L and 170R which are integrally attached to a flow holes 114L and 114R, respectively. Furthermore, flow diverters 170R and 170L are angled upward relative to the downset support pad 112 with angle of attack Ø.

During the encapsulating process, a support post (not shown) is inserted through the support hole 115 thereby bifurcating the primary encapsulant flow 130 to form lateral flowstreams 130R and 130L. In this embodiment, flowstreams 130R and 130L may require locating flow holes 114L and 114R (with the associated flow diverters 170L and 170R) to a position as illustrated in FIG. 2.

FIG. 3 is a diagrammatic cross sectional view of the lead frame shown in FIG. 2 illustrating the angle of attack Ø and the upper flowstream 131 and lower flowstream 132. The upper flowstream 131 and the lower flowstream 132 of encapsulating material are created when the primary flow of encapsulant 130 encounters the downset portion of the support pad 112. As discussed above,the fact the upper flowstream 131 has a flowrate substantially greater then the lower flowstream 132 is the source of the problems associated with the use of conventional leadframes in this method of forming a semiconductor package. The presence of the flow diverter 170 integrally attached to flow hole 114 enables the substantial equalization of the upper and lower flowstreams thereby effectively eliminating the problems associated with conventional leadframes used in this method of packaging semiconductor devices.

The present invention is not limited to single die configurations. Rather, the single die configuration detailed above is used as an example to illustrate the simplicity of a packaged integrated circuit design according to the present invention and its advantages over the prior art. In fact, the described invention applies equally well to multi-chip module assemblies.

Figure 4A:
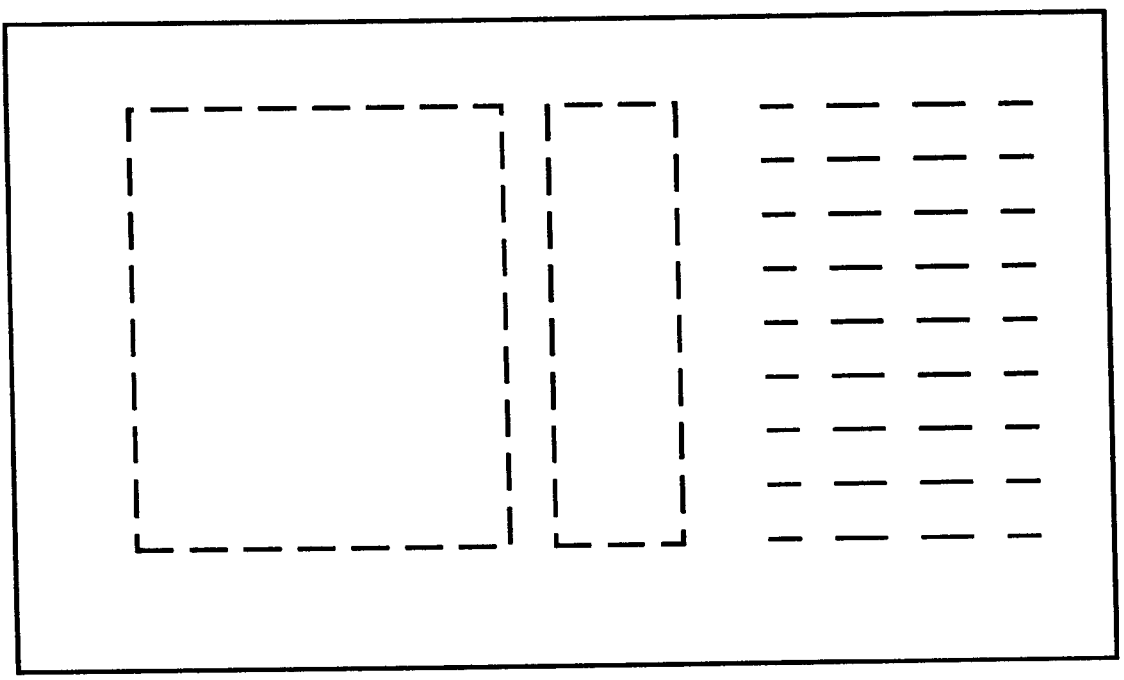
FIG. 4A is a diagrammatic topside view of a pattern on the surface of a lead frame blank for a support pad, leads, die attach area, support hole, flow holes, and material flow diverter.
Figure 4B:
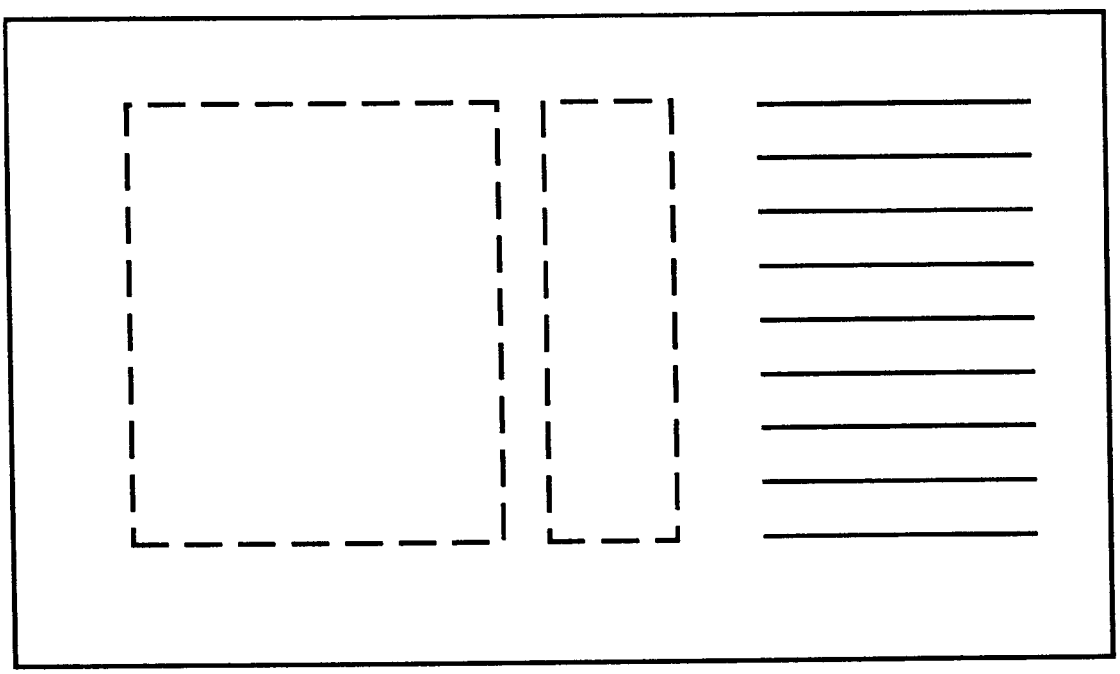
FIG. 4B is a diagrammatic topside view of a leadframe after the patterned structures are formed.

A method for fabricating a semiconductor device package utilizing a leadframe according to the present invention is now described. As illustrated in FIG. 4A, the structures of the leadframe which include a support pad 112, leads 111, die attach area 113, support hole 115, flow holes 114, and material flow diverters 170 are patterned on the surface of a lead frame blank. As shown in FIG. 4B, the patterned structures are then physically formed by any conventional technique, such as stamping or etching, which in general, works well in forming the aforementioned structures.

Figure 4C:
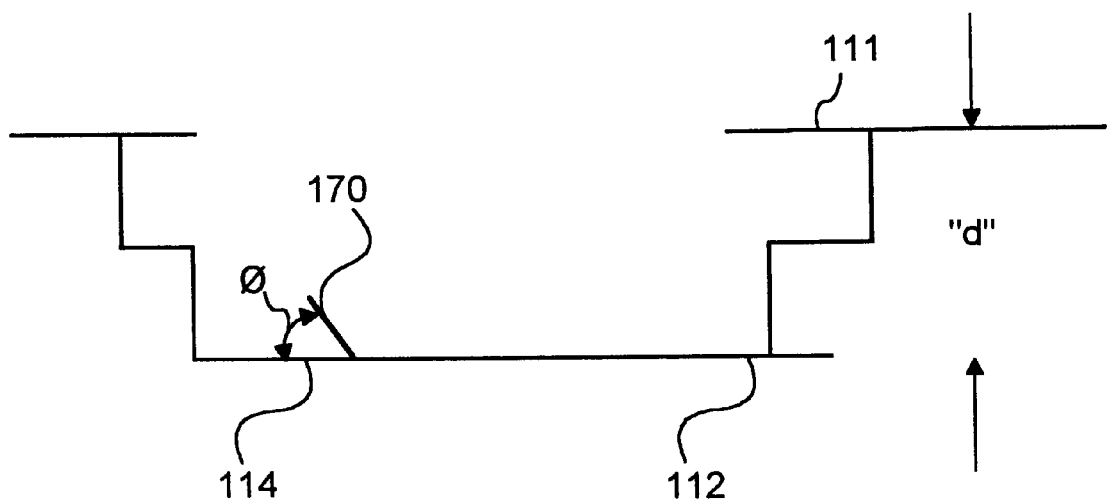
FIG. 4C is a is diagrammatic cross sectional view of a leadframe with a downset support pad and flow diverter.

In the present embodiment, the leads 111 of the leadframe 110 must be substantially coplanar with the upper surface of the attached semiconductor die so as to minimize the length of bond wires used to electrically connect a semiconductor die and associated leads. Therefore, the support pad 112, upon which the die is attached, may be downset relative to the leads as illustrated in FIG. 4C a distance "d" approximating the width of the attached semiconductor die. In one embodiment of the invention, the flow diverter 170 is sized during the process of opening the flowhole 114. Contrary to the conventional method used for forming a flowhole 114 (which consists of removing all the lead frame material contained within the patterned flowhole boundary), the present invention requires only patterning the flow diverters. In the described embodiment, the flow diverters 170 are simultaneously adjustably angled upward relative to the support pad 112 during the downsetting process creating an angle of attack Ø. Alternatively, the flow diverter 170 may be formed separately from the downsetting step.

Figure 4D:
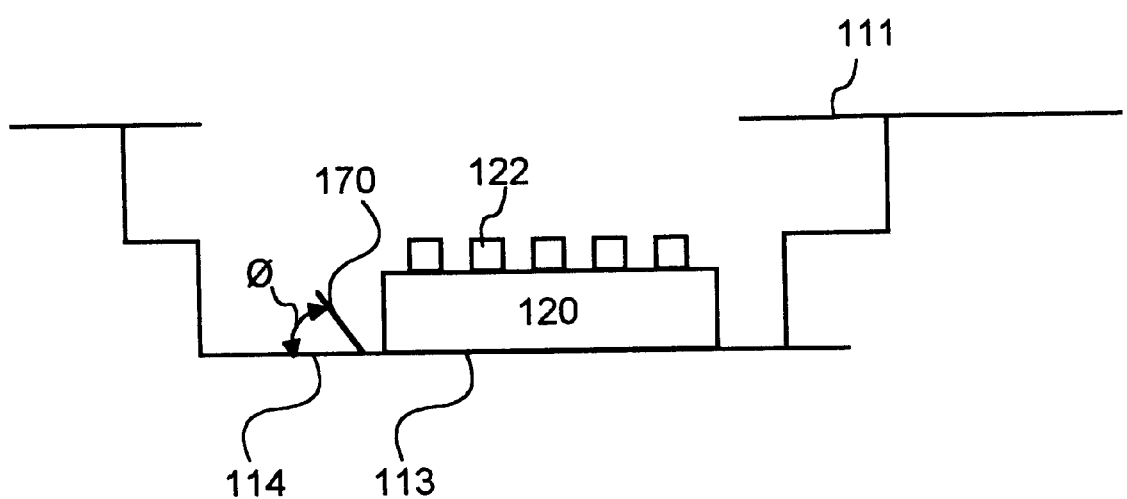
FIG. 4D is a diagrammatic cross sectional view of a lead frame with a downset support pad and flow diverter with a semiconductor die mounted on the die attach area.
Figure 4E:
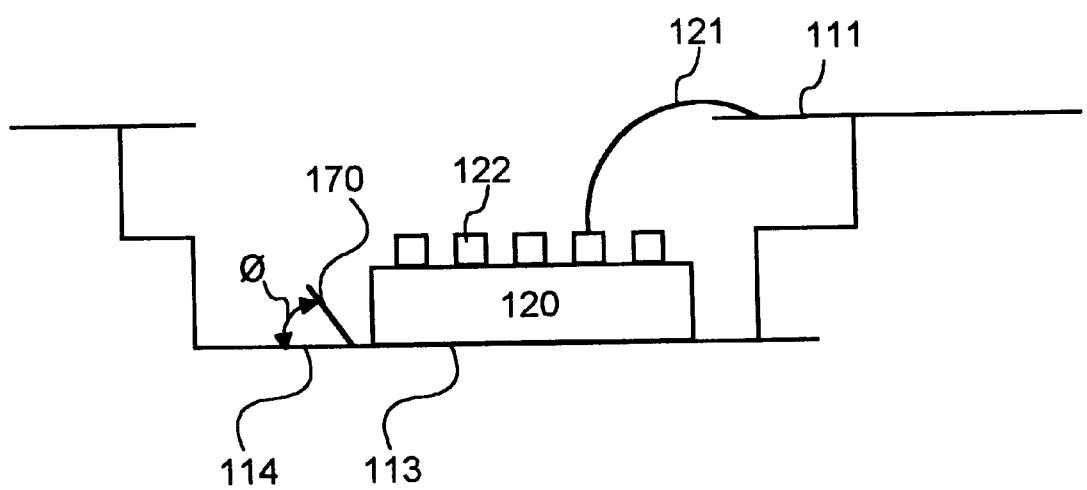
FIG. 4E is a diagrammatic cross sectional view of a lead frame with a downset support pad and flow diverter having an attached semiconductor die electrically connected to external leads of leadframe.

Subsequent to the support pad 112 downsetting step, as illustrated in FIG. 4D, the semiconductor die 120 is attached to the die attach area 113 using conventional techniques well known to those skilled in the art. The semiconductor die 120 is then electrically connected by a plurality of bonding wires 121 to associated ones of leads 111 as illustrated in FIG. 4E, thereby defining an electrical path between the semiconductor die 120 and the leads 111.

Figure 4F:
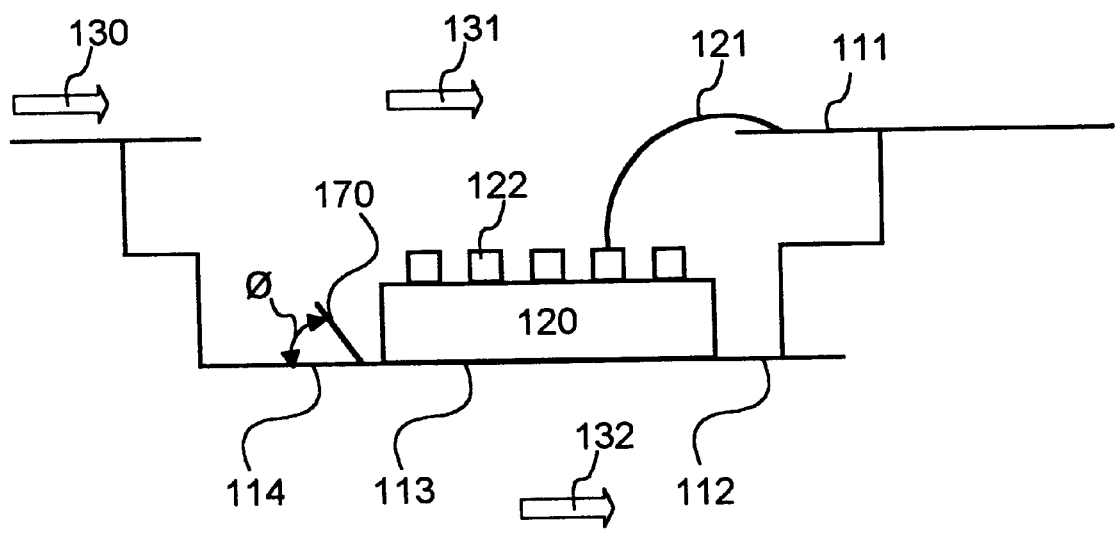
FIG. 4F is a diagrammatic cross sectional view of a lead frame with a downset support pad and flow diverter with attached semiconductor die during the encapsulation process.
Figure 4G:
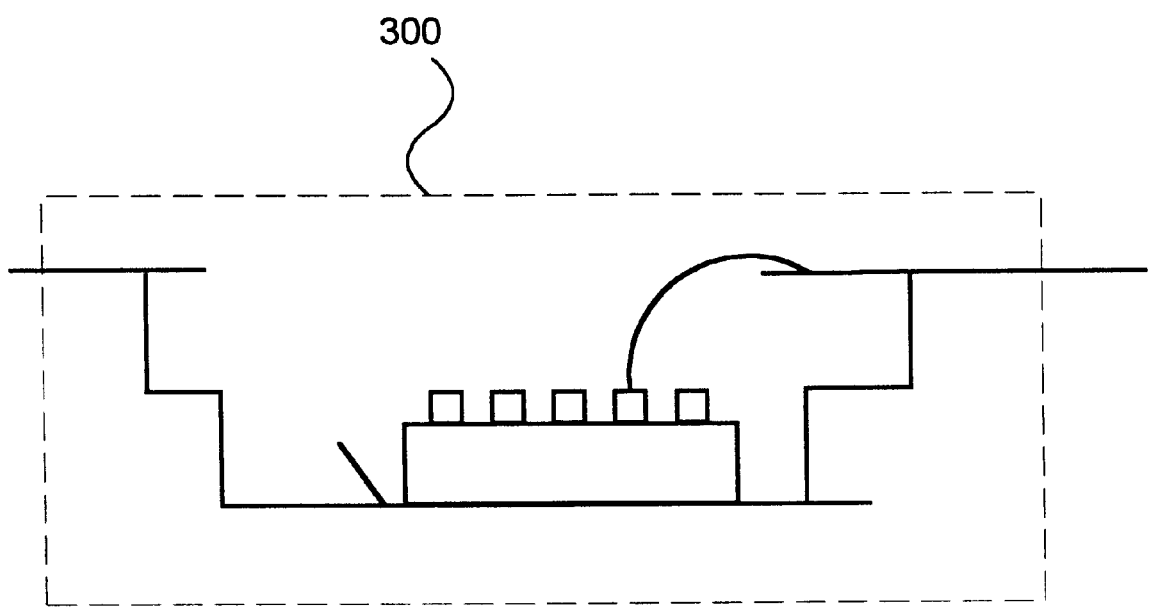
FIG. 4G is a diagrammatic cross sectional view of the final form of the encapsulated semiconductor device package.

The encapsulating process, whereby the final form and structure of the semiconductor device package is created, is illustrated in FIG. 4F. The formation of the final package surrounding the attached semiconductor die 120 and lead frame 110 includes the step of encapsulating the semiconductor die 120, the bonding wires 121, and a portion of the leads 111 thereby leaving exposed a portion of the leads 111 to facilitate electrical connection of the semiconductor die to external circuitry or devices. Due to the downset nature of the support pad, the primary flow of encapsulating material 130 is bifurcated into a secondary lower flow 131 and a secondary upper flow 132. Unfortunately, without the presence of flow diverter 170, secondary upper flow 132 has a substantially greater flowrate than secondary lower flow 131 thereby creating many of the aforementioned problems associated with conventional lead frames. Advantageously, the flow diverter 170 enables the substantial equalization of these described secondary encapsulant flows 131 and 132, thereby effectively eliminating the encapsulation problems associated with conventional lead frames.

Step 4G is a diagrammatic cross sectional view of the final form of the encapsulated semiconductor device package.

Figure 5:
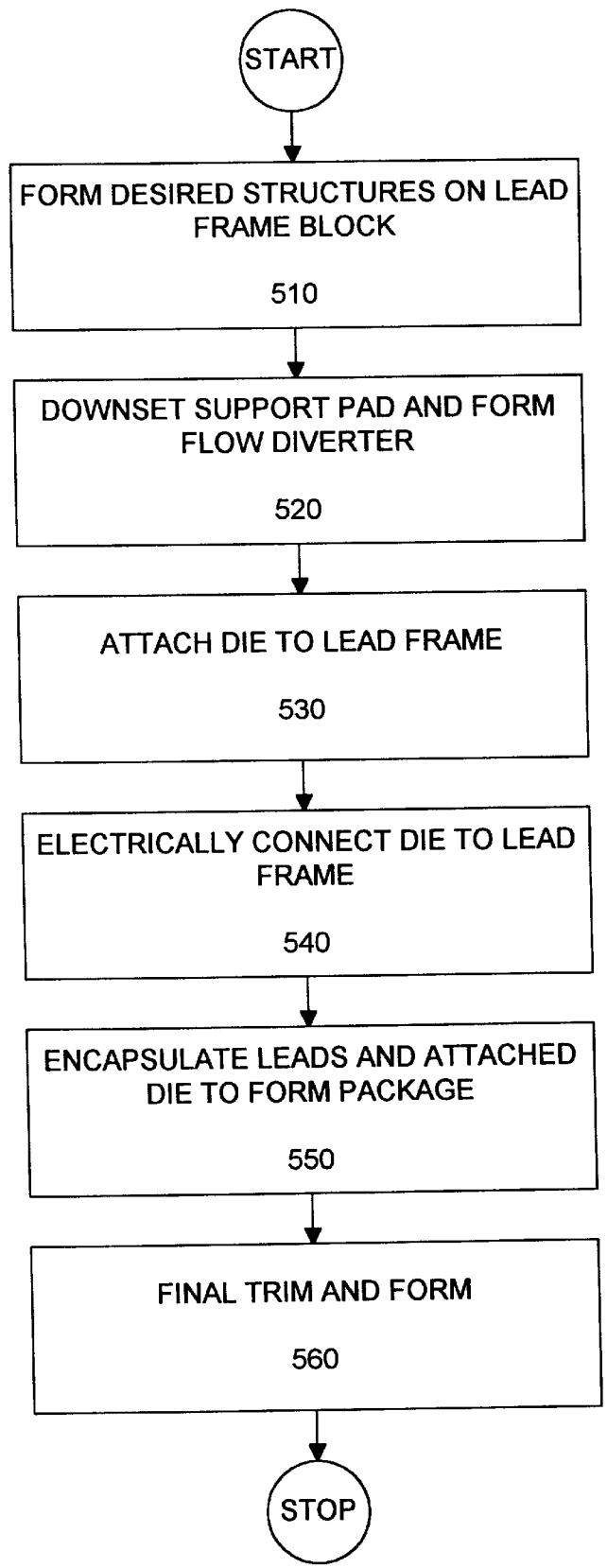

FIG. 5 illustrates the process 500 whereby a semiconductor package is formed utilizing a leadframe according to the present invention. Step 510 includes patterning the desired structures, such as a support pad, leads, die attach area, support hole, flow holes, and material flow diverter, on a lead frame blank. The formation of these structures may be accomplished by first creating a pattern upon the surface of the lead frame blank followed by an etching, stamping, or by any other method or process known to those of reasonable skill in the art. Step 520 includes the process of downsetting the support pad a distance such that the bond pads on the surface of the attached semiconductor die are substantially coplanar with the leads. This is made necessary by the desire to minimize the electrical path between the semiconductor die and external circuitry or devices and reduce stress during the encapsulation process. In this embodiment, the flow diverters are formed during the downsetting process. However, the formation of the flow diverters is not strictly limited to the downsetting step in the process, the flow diverters may be formed in any step exclusive of actual encapsulation of the die and leadframe.

Step 530 includes the process of attaching the semiconductor die to the die attach area of the lead frame using conventional techniques already known to those skilled in the art. Step 540 includes the process of electrically connecting the attached semiconductor die to the leads of the lead frame thereby defining an electrical path between the semiconductor die and any external instrumentality. Step 550 includes the process of encapsulating the attached semiconductor die and a substantial portion of the lead frame. The present invention advantageously allows the flow of encapsulant around the attached semiconductor die to be adjustably distributed in such a manner so as to eliminate any of the aforementioned problems generally associated with conventional leadframes. Step 560 includes the final cure, trim and form required to deliver the final form of the packaged semiconductor device.

One of the advantages of this embodiment is the minimal impact on the lead frame manufacturing process. As described in detail above, the flow diverters are patterned and sized during the same etching or stamping process which created the flow holes in the prior art lead frame, the only difference being instead of opening the flow hole by removing all the lead frame material only a portion is removed leaving a flap of lead frame material which is subsequently angled upward relative to the lead frame body.

Another advantage of the present invention is the ability to adjust the angle of the flow diverter relative to the lead frame body, in this way the flow rates for the upper and lower flowstreams may be adjusted and controlled.

Although, several embodiments of the present invention have been described in detail, it should be understood that the present invention may be embodied in many other specific forms without departing from the spirit or scope of the invention. Particularly, the flow diverter forming step may be performed by other methods other then etching or stamping. Also, future developments such as laser etching technology or improved techniques in lead frame stamping can be readily incorporated in the advantages of the present invention. The present invention applies to all types of semiconductor device packages using a plastic or resin encapsulating materials and include but are not limited to dual in-line pin, lead die carrier, quad flat pack, and pin grid array package. Therefore, the present examples are to be considered as illustrative and not restrictive, and the invention is not to be limited to the details given, herein, but may be modified with the scope of the appended claims.

I claim:

1. A lead frame comprising:
   a plurality of leads;
   a support pad that is offset relative to the plurality of leads, the support pad including a flow hole therein; and
   a material flow diverter integrally formed with the support pad, the material flow diverter being positioned adjacent the flow hole and angled upwardly relative to the support pad.

2. A lead frame as recited in claim 1 wherein the support pad further includes a die attach area having an upper surface and a lower surface and the flow diverter and flow hole are spaced apart from the die attach area.

3. A lead frame as recited in claim 1 wherein the support pad further includes a second flow hole and a support hole, the lead frame further comprising a second material flow diverter positioned adjacent the second flow hole, the flow diverters being positioned on opposite sides of the support hole.

4. A packaged semiconductor comprising:
   a lead frame as recited in claim 3;
   an integrated circuit attached to the upper surface of the die attach area, the integrated circuit having a plurality of bond pads;
   a multiplicity of bonding wires for electrically coupling selected ones of the bond pads to associated leads in the lead frame;
   an encapsulating material that encapsulates the integrated circuit, the bonding wires and at least a portion of the lead frame.

5. A packaged semiconductor as recited in claim 4, wherein the flow diverters are sized and angled such that when the encapsulating material is applied to encapsulate the integrated circuit, the bonding wire and at least a portion of the lead frame, a first flow rate of encapsulating material beneath the lower surface of the die attach pad is at least as fast as a second flow rate of encapsulating material above the upper surface of the die attach pad.

6. A packaged semiconductor as recited in claim 4 wherein the encapsulating material is plastic.

7. A packaged semiconductor comprising:
   a lead frame;
   a plurality of leads;
   a support pad that is offset relative to the plurality of leads, the support pad including a flow hole and a die attach area having an upper surface and a lower surface;
   a material flow diverter integrally formed with the support pad, the material flow diverter being positioned adjacent the flow hole and angled upwardly relative to the support pad and spaced apart from the die attach pad;
   an integrated circuit positioned on the upper surface of the die attach area, the integrated circuit having a plurality of bond pads;
   a multiplicity of bonding wires for electrically coupling selected integrated circuit bond pads to associated leads in the lead frame; and
   an encapsulating material that encapsulates the integrated circuit, the bonding wires and at least a portion of the lead frame.

8. A packaged semiconductor as recited in claim 7 wherein the support pad includes a second flow hole and a support hole, the packaged semiconductor further comprising a second material flow diverter positioned adjacent the second flow hole, the flow diverters being positioned on opposite sides of the support hole.

9. A packaged semiconductor as recited in claim 8, wherein the flow diverters are sized and angled such that when the encapsulating material is applied to encapsulate the integrated circuit, the bonding wire and at least a portion of the lead frame, a first flow rate of encapsulating material beneath the lower surface of the die attach pad is at least as fast as a second flow rate of encapsulating material above the upper surface of the die attach pad.

10. A method of manufacturing a lead frame, said method comprising the steps of:
    forming a plurality of leads and a support pad from a lead frame blank, the support pad including a die attach area having an upper surface and a lower surface;
    defining a flow diverter in the support pad separated from the die attach area;
    downsetting the support pad relative to the leads; and
    angling the flow diverter upward relative to the support pad to form a flow hole in the support pad.

11. A method as recited in claim 10, further comprising the step of forming a support hole in the support pad and defining a second flow diverter in the support pad wherein the first and second flow holes are positioned on opposite sides of the support hole.

12. A method of packaging a semiconductor device comprising:
    forming a lead frame as recited in claim 11;
    attaching a die to the die attach area of the support pad, the die having a multiplicity of bond pads;
    coupling selected bond pads to associated leads in the lead frame; and
    encapsulating the die and a portion of the lead frame in encapsulant material.

13. A method of forming a packaged semiconductor as recited in claim 12 wherein the flow diverter is sized and angled such the flow rate of encapsulant material beneath the lower surface of the die attach area is substantially the same as the flow rate of the encapsulant material above the upper surface of the die attach area during the encapsulating step.

14. A method of forming a packaged semiconductor as recited in claim 12 wherein the encapsulant is a plastic material.

15. A method of packaging a semiconductor device comprising the steps of:

provide a lead frame, having a plurality of leads, a support pad that is offset relative to the plurality of leads, the support pad including at least one flow hole and a support hole therein, and a material flow diverter integrally formed with the support pad, the material flow diverter being positioned adjacent the flow hole and angled upwardly relative to the support pad;

attaching an integrated die to a die attach area of the support pad, the die having multiplicity of bond pads;

electrically connecting selected bond pads to associated leads in the lead frame; and encapsulating the die and a portion of the lead frame in encapsulant material.

16. A method of forming a packaged semiconductor as recited in claim 12 wherein the flow diverter is sized and angled such the flow rate of encapsulant material beneath the lower surface of the die attach area is substantially the same as the flow rate of the encapsulant material above the upper surface of the die attach area during the encapsulating step.

17. A method of forming a packaged semiconductor as recited in claim 12 wherein the encapsulant is a plastic material.

* * * * *